United States Patent [19]

Fericean et al.

[11] Patent Number: 5,408,132

[45] Date of Patent: Apr. 18, 1995

[54] PROXIMITY SWITCH OPERATING IN A NON-CONTACTING MANNER

[75] Inventors: Sorin Fericean, Leonberg; Heinz Kammerer, Ostfildern; Hans-Werner Plank, Reutlingen, all of Germany

[73] Assignee: Gebhard Balluff Fabrik feinmechanischer Erzeugnisse GmbH & Co., Neuhausen, Germany

[21] Appl. No.: 281,264

[22] Filed: Jul. 27, 1994

Related U.S. Application Data

[63] Continuation of Ser. No. 912,545, Jul. 13, 1992, abandoned.

[30] Foreign Application Priority Data

Jul. 18, 1991 [DE] Germany ............ 41 23 828.1

[51] Int. Cl.⁶ ............................................. H01H 35/00
[52] U.S. Cl. ........................... 307/116; 307/125; 361/179; 361/180
[58] Field of Search .............. 307/112, 115, 116, 125; 361/170, 179, 180

[56] References Cited

U.S. PATENT DOCUMENTS 4,135,124 1/1979 Buck .................................... 361/180

FOREIGN PATENT DOCUMENTS 3608639 9/1986 Germany.
3615452 11/1987 Germany.
3615463 11/1987 Germany.
3807484 9/1989 Germany.
4006893 9/1991 Germany.

OTHER PUBLICATIONS

Michael Herfurth, "IC für induktive Näherungsschalter-Eigenschaften," *Der Elektroniker*, No. 5, 1991, pp. 6–10.

*Primary Examiner*—Jeffrey A. Gaffin
*Attorney, Agent, or Firm*—Barry R. Lipsitz

[57] ABSTRACT

A proximity switch is provided which has a programmable parameter such as a programmable switching threshold and/or programmable switching function. The device is programmable using a digital signal that is applied to a conventional terminal of the proximity switch. For example, the conventional power signal for operating the proximity switch can be modulated by a programming signal for use in programming the proximity switch parameters. The program signal could also be input to a conventional output terminal of the proximity switch.

24 Claims, 6 Drawing Sheets

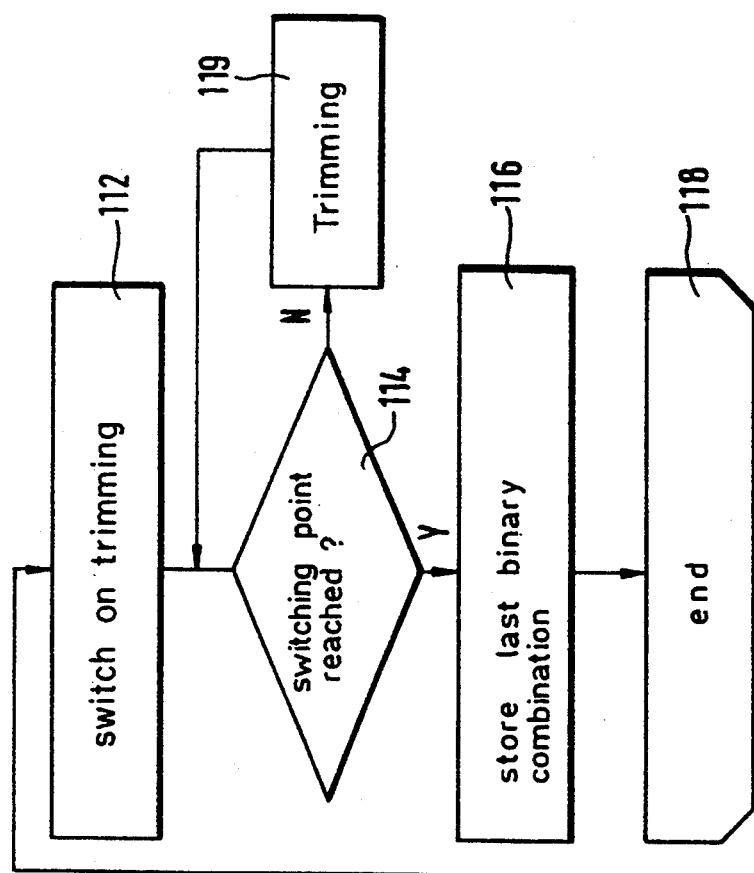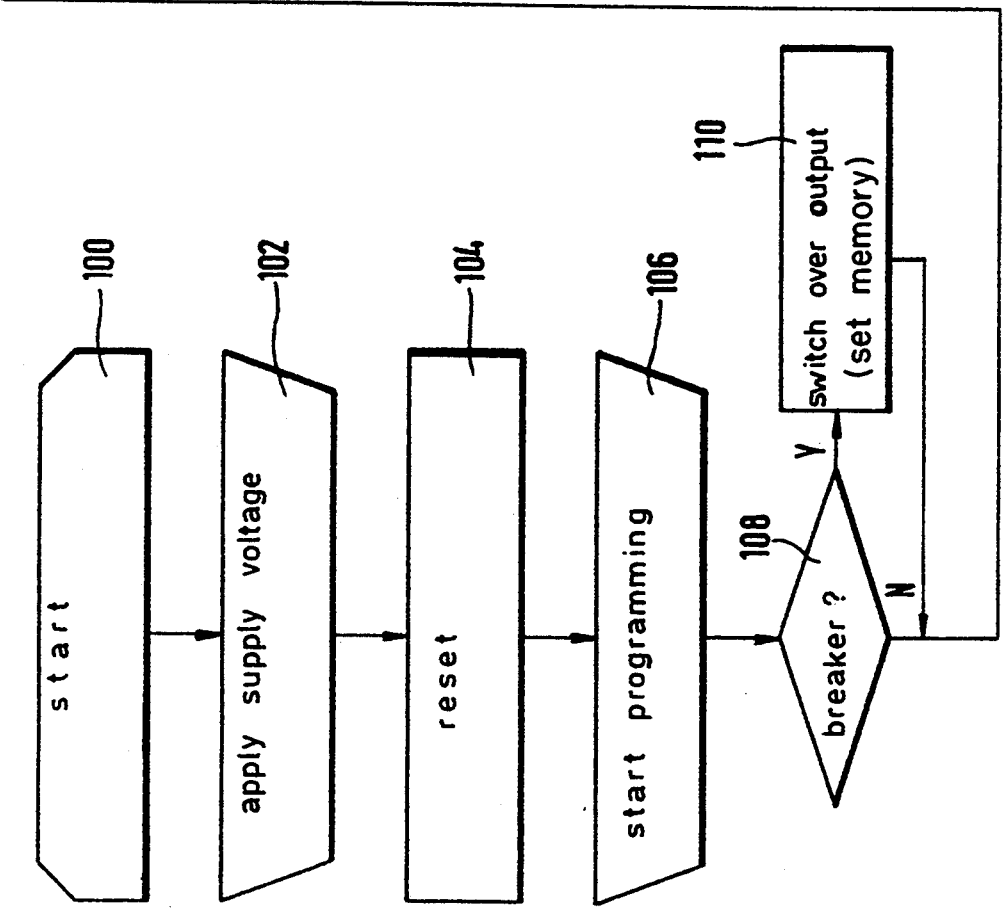
Fig. 6

PROXIMITY SWITCH OPERATING IN A NON-CONTACTING MANNER

This application is a continuation of commonly assigned, U.S. patent application Ser. No. 07/912,545 filed Jul. 13, 1992, now abandoned.

BACKGROUND OF THE INVENTION

The invention relates to a proximity switch operating in a non-contacting manner and comprising a tank circuit influenceable by objects approaching it from the outside, evaluating stages for generating an output signal as a function of an output quantity of the tank circuit exceeding a predetermined threshold value, terminals for applying a supply voltage and at least one further terminal for output of the output signal and programming trimming devices for adjustment of a trimmable circuit parameter.

Such a proximity switch, more precisely, an inductive proximity switch, is known from German published patent application 36 08 639. In the known proximity switch, the resistivity of a resistor connected in parallel with an oscillator circuit is adjusted when a predetermined distance between an object and the active surface of the sensor part of the proximity switch is reached by monitoring the damping of the oscillation of the tank circuit when several resistors in parallel connection are deactivated one after the other by breaking a switch connected in series with the respective resistor. The thus determined combination of one or several resistors is then permanently and irreversibly fixed by blowing fuses.

The known proximity switch has the disadvantage that the trimming of the resistivity can only be carried out once and that errors in this adjustment can never be corrected again.

A particularly serious disadvantage of the known switch according to German published patent application 36 08 639 is that the proximity switch has to have a special additional terminal for feeding the proximity switch a control signal when trimming of the resistivity is to be carried out.

It is, furthermore, known from U.S. Pat. No. 4,502,042 to alter the sensitivity or reaction distance in a proximity switch by adding different resistors. However, in the known proximity switch, this measure is not for trimming purposes but for determining the position of an object to be detected within a maximum detectable measuring range after adjustment of the oscillator has already been carried out. The reaction distance is traversed cyclically from larger to smaller values or vice versa by connecting the resistors without enabling a precisely predetermined reaction distance to be reached by a simple connection to a predetermined combination of resistors.

SUMMARY OF THE INVENTION

Starting from the prior art, the object underlying the invention is to so improve a proximity switch operating in a noncontacting manner such that at least one circuit parameter of the proximity switch circuitry, in particular a resistivity determining the switching distance, is trimmable at any point in time without additional terminals having to be provided on the proximity switch for this purpose.

This object is accomplished in accordance with the invention in a generic proximity switch by the trimming circuits being designed as freely programmable circuits including data memories and by providing a data transmission circuit, the output of which is connected to the adjusting devices and the input of which is suppliable with the programming data via one of the external terminals of the proximity switch in the form of modulating signals superimposed on the signals and/or potentials at the respective external terminal.

A special advantage of the proximity switch according to the invention is that only the "conventional" terminals of the proximity switch are required to effect the trimming, and so the trimming of the at least one circuit parameter to be adjusted can be carried out on the fully fabricated and already cast proximity switch, even after its installation on a machine or the like. Thus, for example, environmental conditions influencing the switching distance can be taken into consideration when trimming the device.

In a preferred embodiment of the invention, it has proven particularly expedient for the data memories of the trimming circuits to be designed as reprogrammable memory, for example, in the form of an electrically erasable and programmable memory, i.e., an EEPROM. In this embodiment, prior to delivery of a switch to the customer, a basic trimming of the desired proximity switch parameters can be carried out initially in accordance with the intended use and, in the given circumstances, retrimming of one or the other parameter can then be carried out later on the premises to take into consideration the installation conditions and the functions of the switch in accordance with an initially unintended use.

In a further development of the invention, it has proven particularly advantageous for one of the following parameters to be provided as trimmable circuit parameters:
- a resistivity producible by a combination of resistors connectable in a different way with one another and with the other circuit components,
- an electrically conductive connection by means of which operation of the proximity switch is definable as breaker or closer,
- a reference voltage, an amplification factor and/or a coupling factor for determining a switching threshold of a trigger circuit forming a component of the evaluating stages, or
- the activation, the test frequency and/or the test criteria of a test circuit integrated in the proximity switch.

The multiplicity of trimmable parameters imparts to the inventive proximity switch, in particular in combination with use of a reprogrammable data memory, a high degree of flexibility for both the manufacturer and the customer. Therefore, storage is simplified for the manufacturer and can be reduced to a few basic types which are trimmed in accordance with the intended use prior to delivery. Also, for the customer or user it is sufficient to have a small number of proximity switches in reserve for correspondingly trimming one of the reserves in the event of failure of a proximity switch used in production and for the faulty proximity switch to then be exchanged.

It is foreseeable that in the future further specific functions of proximity switches will be activatable or not in accordance with the customer's wishes, for example, an adjustment aid for adjustment of the switch to a safe operating range, programming for self-testing, zeroing, etc. For example, a self-testing proximity switch in which test pulses are continuously superimposed on the output signal of the proximity switch is described in German published patent application 35 27 619. A corresponding test circuit could be integrated in the proximity switch and activated or deactivated by programming.

BRIEF DESCRIPTION OF THE DRAWINGS

Further features and advantages of the invention will be explained in greater detail hereinbelow with reference to the appended drawings which show:

FIG. 6 a flow chart for explaining the program flow during the trimming of the proximity switch.

DESCRIPTION OF THE PREFERRED EMBODIMENT

Figure 1:
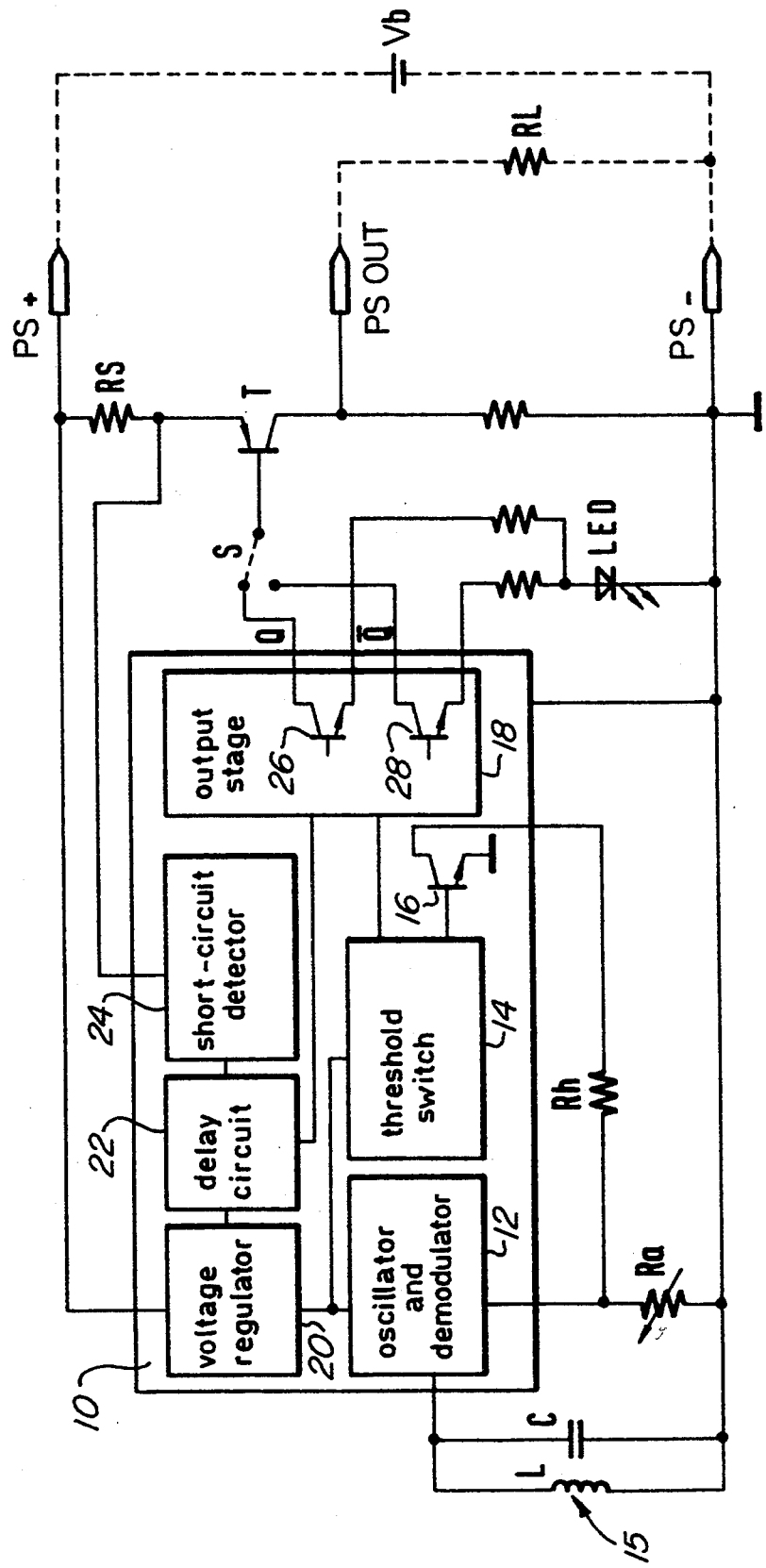
FIG. 1 a basic circuit diagram of a proximity switch.

FIG. 1 shows a proximity switch with a tank circuit 15 comprising a coil L and a capacitor C in parallel connection. The coil L is normally arranged in a pot core whose open side forms the active surface of the sensor. The tank circuit 15 is connected, on the one hand, to the reference potential $V_b$ and, on the other hand, to an input of a proximity switch integrated circuit generally designated 10 comprising in a conventional manner the following circuits:

An oscillator and demodulator circuit 12 to which the tank circuit 15 is connected, the tank circuit being a component of the oscillator; a threshold switch circuit 14 which is connected to the output of the oscillator and demodulator circuit; a hysteresis transistor 16 for generating switching hysteresis which is connected to the output of the threshold switch circuit, the threshold switch circuit having a further output connected to an output stage 18 which provides the necessary output power and, as indicated in the schematic illustration of FIG. 1, includes, for example, two output power transistors 26, 28. Other circuits of the integrated proximity switch circuit 10 are a voltage regulator and monitoring circuit 20, a delay circuit 22 for suppressing switch-on pulses and a short-circuit detector 24, these being connected in the conventional manner. The two power transistors of the output stage 18 define circuit outputs Q and $\overline{Q}$, the $\overline{Q}$ output being inverted with respect to the Q output. These are selectively connected via a switch S to the base of a switching transistor T at the output of the proximity switch which has three terminals designated PS+, PS− and PS OUT. The supply voltage $V_b$ is connected to terminal PS+, while a reference potential is connected to terminal PS−. The third terminal PS OUT supplies the output signal of the proximity switch.

FIG. 1 shows in broken lines a load RL, a supply voltage source $V_b$ and connected in series with the switching transistor T a sensing resistor RS which is connected to the short-circuit detector. A light-emitting diode LED connectable to the transistors 26, 28 of the output stage 18 serves as an on/off state. An external resistor-Ra connected to the oscillator and demodulator circuit 12 serves to balance the oscillator amplitude. When the hysteresis transistor 16 is in the conductive state, a hysteresis resistor Rh is connected in parallel with the resistor Ra.

In accordance with the invention the object is, for example, in a proximity switch as shown in FIG. 1 and described hereinabove, after completion of the assembly and casting of the switch and, in the given circumstances, after installation of the switch on a machine, to carry out trimming of the switching distance of the proximity switch by control of the resistor Ra and also to define the function of the proximity switch as a circuit breaker or closer by corresponding selection of the connection established via the switch S.

Figure 2:
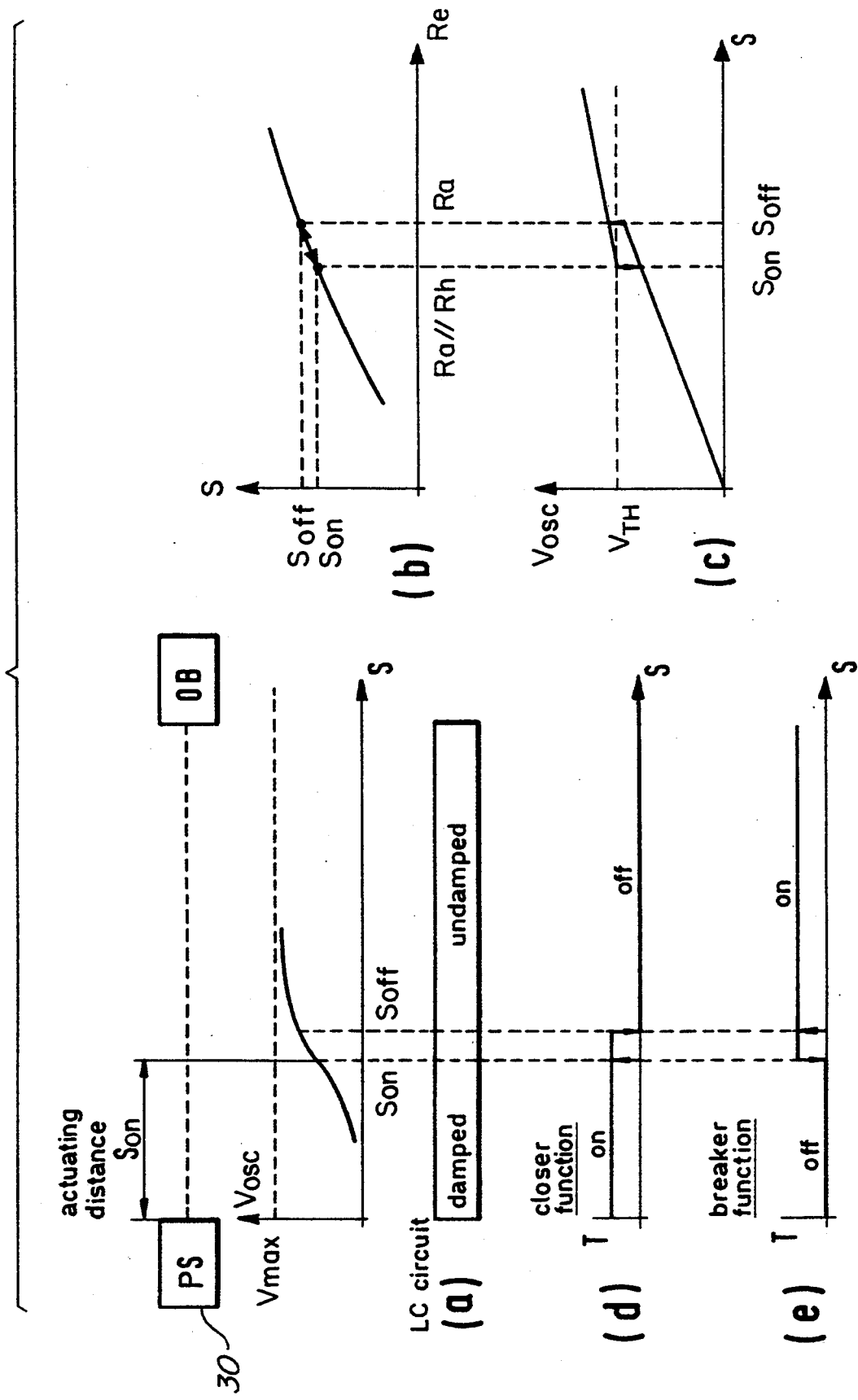
FIG. 2 graphical illustrations for use in explaining the switching distance and the switching hysteresis as well as the breaker/closer function of a proximity switch according to FIG. 1.

The special significance of trimming the switching distance by the resistor Ra is apparent from the diagrams shown in FIG. 2. With the aid of a proximity switch 30(PS) indicated in FIG. 2a, a target object OB is to be detected when it comes so close to the proximity switch 30 that the distance between the switch 30 and the object OB corresponds to a predetermined actuating distance $S_{on}$, at which the proximity switch is turned on. The curve of the oscillator output signal $V_{osc}$ is also shown over the distance between switch 30 and target object OB in an associated diagram of FIG. 2a. When the target object OB is at a far distance, the oscillator output signal is near its maximum value $V_{max}$. When the object OB moves from the right closer to the proximity switch 30, the oscillator output signal decreases and reaches a switch-on threshold $V_{TH}$ (FIG. 2c) when the predetermined actuating distance $S_{on}$ is reached. When this switch-on threshold is reached, the threshold switch circuit 14 delivers a signal which switches the hysteresis transistor 16 to a non-conductive state. The hysteresis resistor Rh is thereby dis-connected, which results in a higher, total resistance RA seen by oscillator and demodulator 12, causing an abrupt decrease in the oscillator output voltage $V_{osc}$. Conversely, when the target object OB moves back away from proximity switch 30, the oscillator output signal increases abruptly at distance $S_{off}$. The resultant hysteresis effect is shown most clearly in FIG. 2c. In FIG. 2c, the associated course of the output voltage $V_{osc}$ is shown over the distance s. In accordance with FIGS. 2b and 2c, the adding of the hysteresis resistor Rh in parallel with resistor Ra by transistor 16 produces a switching hysteresis between the switch-off distance $S_{off}$ and the switch-on distance $S_{on}$.

Finally, the state of the output switching transistor T over the distance s is shown for a closer switching function of the proximately switch in FIG. 2d and for a breaker function in FIG. 2e.

Figure 3:
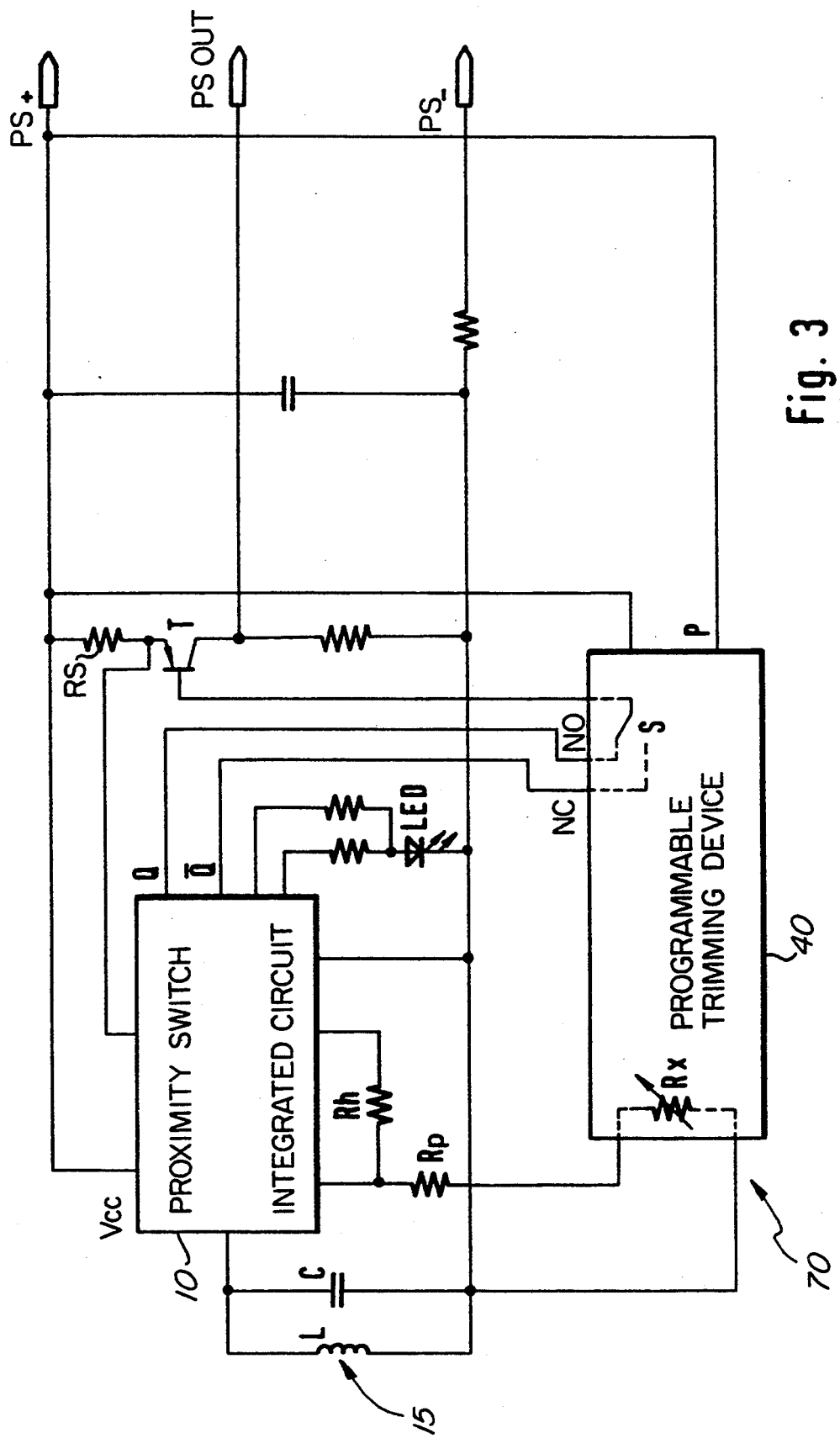
FIG. 3 a basic circuit diagram of a preferred embodiment of a proximity switch according to the invention.

FIG. 3 shows an inventive proximity switch of the same design as the proximity switch according to FIG. 1, but with the resistor Ra replaced by a fixed preresistor $R_p$ and a digitally controllable resistor Rx which is connected in series with it and is a component of a programmable trimming device 40. Also, the outputs Q and $\overline{Q}$ of the output stage of the proximity switch integrated circuit 10 and the switch S for switching over from breaker to closer function and vice versa are shifted to the device 40 which is connected via a programming input line P to the supply voltage terminal PS+ of the proximity switch.

Figure 4:
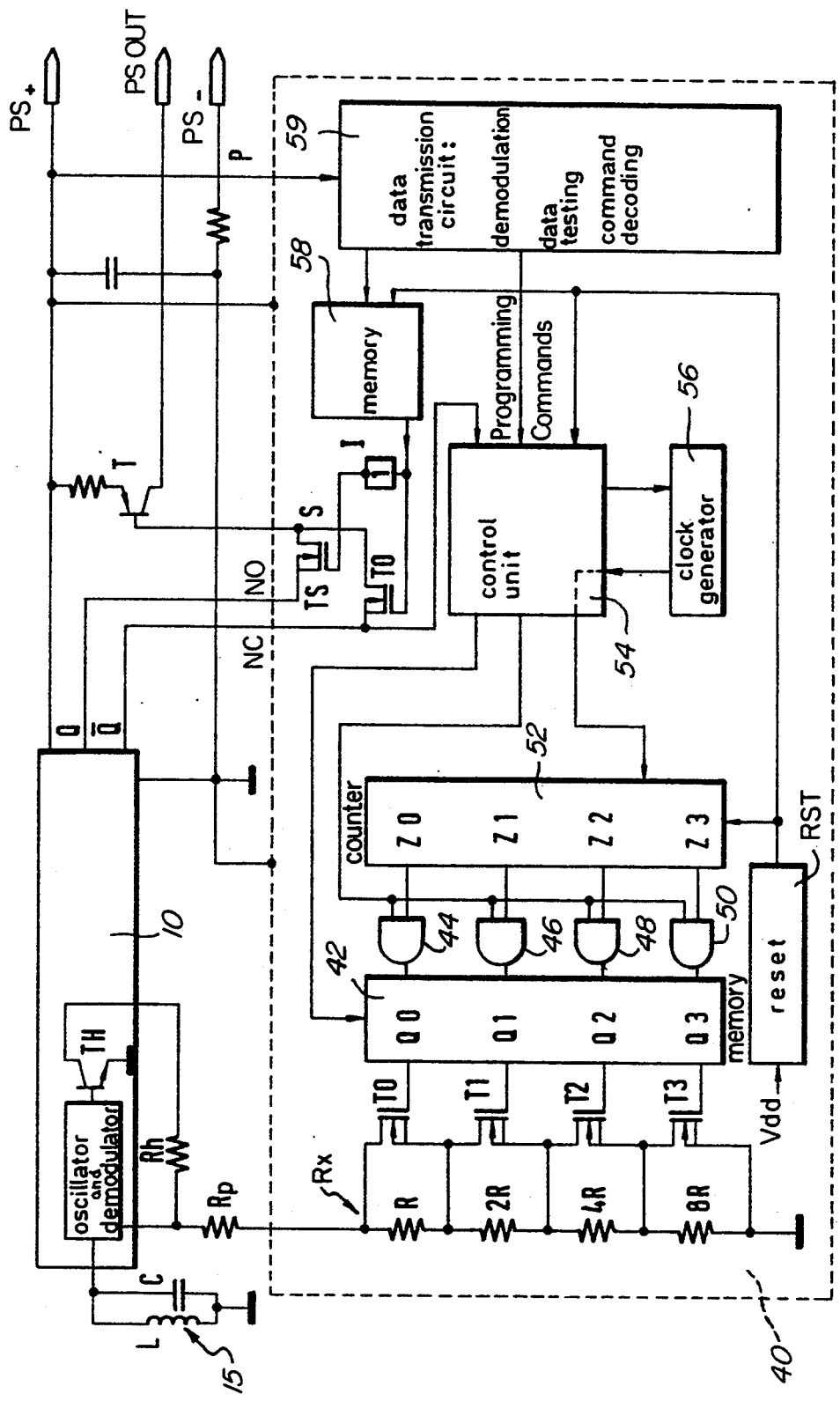
FIG. 4 a basic circuit diagram of the proximity switch according to FIG. 3 with details of the programmable trimming device provided in this switch.

A preferred internal design of the circuit 40 is illustrated—partly in the form of a block circuit diagram—in greater detail in FIG. 4. As indicated, the resistor Rx may include any combination of four resistors R, 2R, 4R, 8R, each of which is connected in parallel with a transistor T0, T1, T2 and T3, respectively. The control terminals of these transistors TO to T3 are connected to the outputs Q0 to Q3 of a data memory 42 whose inputs are each connected via AND gates 44, 46, 48 and 50 to the outputs Z0 to Z3 of a counter 52 which is designed as a down counter and receives its count pulses from a control unit 54 whose input is connected to a clock generator 56. The control unit 54 has additional outputs via which the clock generator 56 can be activated and via which the AND gates 44–50 are prepared for the further communication of signals of the counter 52 to the memory 42. The control unit 54 is controlled by the output of a data transmission circuit 59 whose input is connected to the programming input P. The data transmission circuit demodulates and checks the signals modulated on the supply voltage and arriving via the programming input P and decodes the programming commands contained in the signals which are then passed on to the control unit 54 . A further output of the data transmission circuit 59 is connected to a second 1-bit memory 58 which directly drives a transistor T0 via its output and a second transistor TS via an inverter I, the two transistors TO and TS and the inverter I jointly forming an electronic switch, namely the switch S, for switching over between breaker and closer function of the proximity switch. An initialization circuit RST serves to generate setting and resetting signals for 52, respectively resetting the memory 58 and the control unit 54, for example, when the supply voltage is applied.

Figure 5:
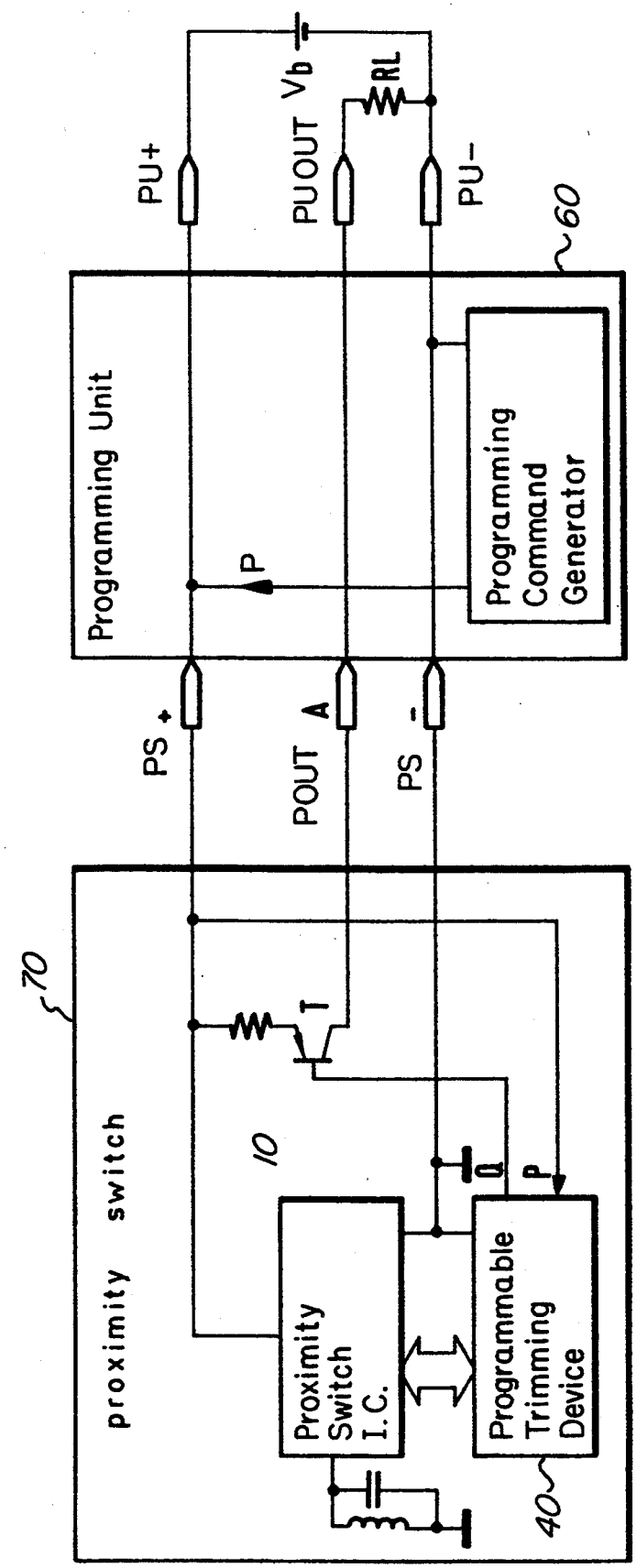
FIG. 5 a schematic block circuit diagram for explaining the programming of a proximity switch according to FIG. 3 and 4 with the aid of a programming unit.

In accordance with FIG. 5 of the drawings, the signals containing the programming commands for the circuit 40 which are modulated on the supply voltage are generated with a programming unit 60 which is simply connected between the PS+, PS OUT and PS− terminals of the proximity switch, on the one hand, and the terminals PU+, PUOUT and PU− for the supply voltage source $V_b$ and load RL, on the other hand. In this embodiment, modulated signals will be generated with the programming unit 60 causing, via the circuit 40, the selection of the breaker/closer function of the proximity switch and adjustment of the resistor Rx to the desired value and hence trimming the proximity switch 70 to a desired switching distance.

FIG. 6 shows in the form of a flow chart how the programming is carried out in a programmable proximity switch 70 according to the embodiment described hereinabove. In accordance with block 100, at the beginning of a trimming procedure the desired switching distance between the proximity switch and the target object OB is first adjusted mechanically; i.e., the proximity switch is mounted at the desired switching distance. The supply voltage is then applied at block 102. The counter 52 will then be set and memory 58 and the control unit 54 will be reset to bring the proximity switch to a defined initial state (e.g., of a closer switching function) and the lowest switching distance, as shown at block 104. The actual programming then starts in accordance with block 106. In accordance with block 108, a decision is first made on the breaker/closer function of the proximity switch. In the event that the breaker function is selected, the 1-bit memory 58 has to be set as indicated at box 110.

In a second sequence of steps, a second sequence for the trimming of the switching distance is initiated in accordance with block 112. The output signals of the counter 52, counting down stepwise, are taken over stepwise by the data memory 42 and bring the corresponding transistors TO to T3 into a conductive state in order to select a certain combination of the resistors R, 2R, 4R, 8R and in this way adjust the desired resistivity of the resistor Rx. After each step or clock, a check is made in accordance with block 114 as to whether the switching point has been reached. If not, the counter 52 counts down a further step to trim the switching point as indicated at box 119. If so, in accordance with block 116 the last binary combination contained in the counter 52 is stored in the data memory 42. The program is then terminated in accordance with block 118.

In accordance with the invention, the programming signals supplied to one of the "conventional" terminals of the proximity switch (e.g., in the embodiment shown, to terminal PS+) can be modulated on a carrier signal in any suitable way, for example, by amplitude, frequency or pulse-code modulation. Appropriate devices are provided in the programming unit 60 for generating the modulation signals, whereas the demodulation of the signals supplied from the switch terminal PS+ via the programming input P is carried out by an appropriate demodulation stage in the data transmission circuit 59.

It will be clear from the above description that with a fully fabricated proximity switch, i.e., with a proximity switch ready for sale, which, in the given circumstances, may already be installed on a machine at the operating site, the invention provides the possibility of, for example, fixing the breaker/closer function by appropriate programming and/or the switching distance by programming the resistor Rx. In principle, very different circuit parameters of the proximity switch can be programmed in this way at any desired point in time and reprogrammed if programmable memories are used. This involves considerable progress for the storage of proximity switches, for the exchange of faulty proximity switches and for the adaptation of proximity switches to altered operating conditions at the operating site.

The present disclosure relates to the subject matter disclosed in German application No. P 41 23 828.1 of Jul. 18, 1991, the entire specification of which is incorporated herein by reference.

What is claimed is:

1. A switch having electronic circuitry and including conventional input/output terminals for receiving a voltage to supply the switch and outputting a switching signal indicative of the presence of an object comprising:

a sensor responsive to an object for generating an output signal;

an evaluating circuit coupled to said sensor for evaluating said output signal and generating said switching signal if said output signal exceeds a predetermined threshold value;

a demodulating circuit coupled to receive a modulated signal from at least one of said terminals for demodulating the modulated signal to recover digital programming data;

a trimming circuit responsive to said digital programming data for trimming at least one adjustable parameter of said electronic circuitry; and a memory associated with said trimming circuit for storing said at least one adjustable parameter after it has been trimmed.

2. A switch in accordance with claim 1 wherein said sensor comprises a tank and an oscillator circuit.

3. A switch in accordance with claim 2 wherein said evaluating circuit includes a threshold switch receiving an operating parameter controlled by said sensor.

4. A switch in accordance with claim 1 wherein said digital programming data is carried on said modulated signal by one of amplitude, frequency or pulse code modulation.

5. A switch in accordance with claim 1 wherein a signal or potential applied to at least one of said terminals from outside said switch is modulated by said digital programming data within a trimming period during operation of said switch.

6. A switch in accordance with claim 1 wherein said electronic circuitry is responsive to said digital programming data for setting said predetermined threshold value.

7. A switch in accordance with claim 6 wherein said electronic circuitry comprises a test circuit having at least one of a test cycle time or a test criteria that is responsive to said digital programming data.

8. A switch in accordance with claim 1 wherein said electronic circuitry comprises a programmable internal switch responsive to said digital programming data for configuring said switch to function as a circuit breaker or a circuit closer.

9. A switch in accordance with claim 1 wherein said electronic circuitry includes at least one of a programmable reference voltage source, a programmable amplification factor, a programmable sensitivity, a programmable switching distance of said sensor, or a programmable coupling factor that is trimmable in response to said digital programming data.

10. A switch in accordance with claim 8 wherein said electronic circuitry comprises a test circuit having at least one of a test cycle time or a test criteria that is responsive to said digital programming data.

11. A switch in accordance with claim 1 wherein said electronic circuitry comprises a test circuit having at least one of a test cycle time or a test criteria that is responsive to said digital programming data.

12. A switch in accordance with claim 1 wherein said electronic circuitry comprises a programmable resistance that is responsive to said digital programming data.

13. A switch in accordance with claim 12 wherein said programmable resistance is used for setting a predetermined threshold value to trim said detection distance.

14. A switch in accordance with claim 1 wherein said trimming circuit successively changes parameters during a trimming period and after each change said trimming circuit tests said sensor to determine whether or not it has reached a switching point.

15. A switch in accordance with claim 14 wherein the change of parameters is interrupted after said switching point is reached.

16. A switch in accordance with claim 15 wherein said change is performed in a trimming cycle which is started by application of said programming data.

17. A switch in accordance with claim 1 wherein said sensor is responsive to an object at a predetermined detection distance.

18. A switch in accordance with claim 1 wherein said sensor is responsive to an approaching object and generates said output signal in dependence on a distance to said object.

19. A switch in accordance with claim 1 wherein a decoding circuit is provided for generating programming commands from said digital programming data, said programming commands being used for controlling said trimming circuit.

20. A switch in accordance with claim 1 wherein the conventional terminal outputting said switching signal is connectable to a load powered by said switching signal.

21. A switch in accordance with claim 1 wherein a programming unit is connectable to two of the conventional terminals for programming the switch.

22. A switch in accordance with claim 1 wherein said trimming circuit comprises a trimming device for trimming said sensor.

23. A switch in accordance with claim 1 wherein a signal or potential applied to at least one of said terminals from outside the switch is modulated by said digital programming data for starting a trimming cycle during the operation of said switch.

24. A switch in accordance with claim 1 wherein said electronic circuitry comprises a programmable internal switch responsive to said digital programming data for configuring said switch to one of several possible switch-functions.

* * * * *